US 6,653,856 B1

(12) United States Patent
Liu

(10) Patent No.: US 6,653,856 B1
(45) Date of Patent: Nov. 25, 2003

(54) METHOD OF DETERMINING RELIABILITY OF SEMICONDUCTOR PRODUCTS

(75) Inventor: Chuan-Hsi Liu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 10 days.

(21) Appl. No.: 10/064,111

(22) Filed: Jun. 12, 2002

(51) Int. Cl.⁷ ............................................. G01R 31/28
(52) U.S. Cl. ...................................... 324/765; 324/769
(58) Field of Search ........................... 324/765, 760, 324/769, 158.1; 714/1, 47; 438/14, 17

(56) References Cited

U.S. PATENT DOCUMENTS 6,456,104 B1 * 9/2002 Guarin et al. .............. 324/769
6,476,632 B1 * 11/2002 La Rosa et al. ............ 324/769
6,521,469 B1 * 2/2003 La Rosa et al. ............ 438/17

* cited by examiner

Primary Examiner—Ernest Karlsen
(74) Attorney, Agent, or Firm—Winston Hsu

(57) ABSTRACT

A method of determining reliability of semiconductor products. The method comprises providing a semiconductor wafer, which comprises a plurality of MOS transistors formed on its surface, and placing the semiconductor wafer in an environment of a stress temperature during a testing time period. The MOS transistor is simultaneously stressed with a stress voltage. A plurality of testing points are defined in the testing time, and the threshold voltage shift of the MOS transistor is measured at each testing point for establishing a group of experimental data. Finally, a relationship model of threshold voltage shift ($\Delta V_{th}$) vs. time (t) is provided, and the group of experimental data and the relationship model are used to depict a relation curve for predicting the threshold voltage shift of the MOS transistor when exceeding the testing time.

11 Claims, 3 Drawing Sheets

|  | $B_1$ (mV) | $B_2$ (mV) | $\tau_1$ (hr) | $\tau_1$ (hr) |
|---|---|---|---|---|
| $T_{stress}=180°C$ | 127 | 116 | 0.69 | 22.64 |
| $T_{stress}=140°C$ | 66 | 85 | 1.16 | 70.53 |
| $T_{stress}=115°C$ | 49 | 68 | 1.25 | 75.15 |
| $T_{stress}=40°C$ | 8 | 25 | 0.49 | 74.64 |

Fig. 3

METHOD OF DETERMINING RELIABILITY OF SEMICONDUCTOR PRODUCTS

BACKGROUND OF INVENTION

1. Field of the Invention

The present invention relates to a method of determining reliability of semiconductor products, and more particularly, to a method of determining negative bias temperature instability (NBTI) of PMOS transistors.

2. Description of the Prior Art

Negative bias temperature instability (NBTI) becomes increasingly serious as device dimensions are continually scaled down. It has been reported by N. Kimizuka et al. (VLSI Tech., p.73, 1999) that threshold voltage shift ($\Delta V_{th}$) of PMOS transistors due to NBTI degradation mode starts to limit device lifetime when oxide thickness is less than 3.5 nm.

Although much effort has been recently dedicated to the study of NBTI, the details of the degradation process are not well understood. Therefore, a common method of determining NBTI is by directly stressing samples through package level or wafer level at a high bias and a high temperature for a long period of time, which is at least $10^5$ seconds. Please refer to FIG. 1. FIG. 1 is a schematic diagram of a prior art method of determining reliability of a semiconductor device. As shown in FIG. 1, a PMOS transistor 10 is formed on an N-type substrate 12 of a semiconductor wafer. The prior art method includes placing the semiconductor wafer in a high temperature environment and stressing the gate 16 of the PMOS transistor 10 with a high bias 14. During a testing time period, the threshold voltage of the PMOS transistor is measured and a threshold voltage shift is calculated by operating with the initial threshold voltage of the PMOS transistor before stressing. Furthermore, reliability of the semiconductor device is evaluated.

The prior art method requires at least $10^5$ seconds for measuring the threshold voltage shift of the semiconductor device under a condition of high bias and high temperature. Therefore, the prior determining method must be operated by hand and consumes a lot of time, which results in an increase of product costs.

SUMMARY OF INVENTION

It is therefore a primary objective of the claimed invention to provide a method of determining reliability of semiconductor products for solving the above-mentioned problems.

According to the claimed invention, a method of determining reliability of semiconductor products is provided. The method comprises providing a semiconductor wafer, which comprises a plurality of MOS transistors formed on its surface, and placing the semiconductor wafer in an environment of a stress temperature during a testing time period. The MOS transistor is simultaneously stressed with a stress voltage. A plurality of testing points are defined in the testing time, and the threshold voltage shift of the MOS transistor is measured at each testing point for establishing a group of experimental data. Finally, a relationship model of threshold voltage shift ($\Delta V_{th}$) vs. time (t) is provided, and the group of experimental data and the relationship model are used to depict a relation curve for predicting the threshold voltage shift of the MOS transistor when exceeding the testing time.

It is an advantage over the prior art that the determining method of the claimed invention uses a group of experimental data and a relationship model to depict a curve for predicting threshold voltage shift of a semiconductor device. Therefore, the semiconductor device only needs to be stressed and measured for a short time for depicting a relation curve, which predicts threshold voltage shift of the device during a longer time period. Manpower and time costs of the semiconductor products are thereby effectively reduced.

These and other objectives of the claimed invention will no doubt become obvious to those of ordinary skill in the art after reading the following detailed description of the preferred embodiment, which is illustrated in the multiple figures and drawings.

BRIEF DESCRIPTION OF DRAWINGS

FIG. 3 displays all constant values in a relationship model of the claimed invention, which are calculated by using experimental data under different stress temperature conditions.

DETAILED DESCRIPTION

Figure 1:
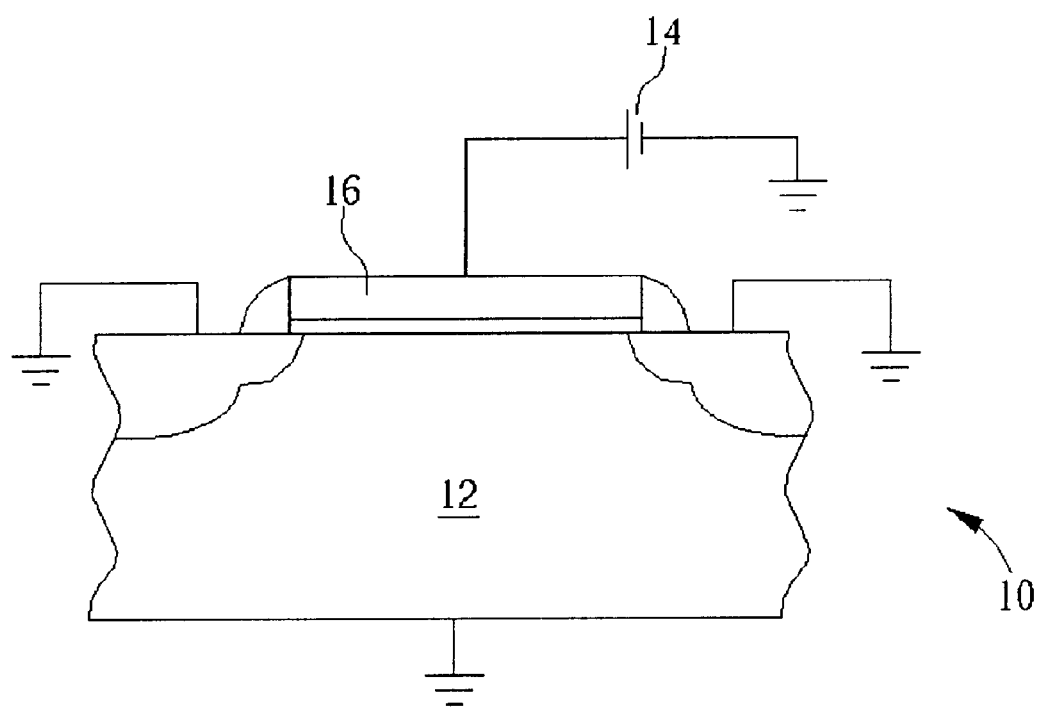
FIG. 1 is a schematic diagram of a prior art method of determining reliability of a semiconductor device.

A method of determining reliability of semiconductor products according to the present invention first provides a semiconductor wafer, and a plurality of PMOS, NMOS, and CMOS transistors are formed on a surface of the semiconductor wafer. As with the prior art determining method shown in FIG. 1, the semiconductor wafer is placed in an environment of a stress temperature during a testing time period, and the PMOS transistor is simultaneously stressed with a stress voltage. Differing from the prior art method, the method according to the present invention defines a plurality of testing points during only $10^3$ to $10^4$ seconds of a testing time period and measures a threshold voltage shift of the PMOS transistor at each testing point so as to establish a group of experimental data. At the same time, the method according to the present invention provides a relationship model of threshold voltage shift ($\Delta V_{th}$) vs. time (t):

$$\Delta V_{th}(t) = B_1[1-\exp(-t/\tau_1)] + B_2[1-\exp(-t/\tau_2)]$$

where $B_1$ and $B_2$ are interface defect constants, and $\tau_1$ and $\tau_1$ are time constants. The group of experimental data is then used to fit the relationship model by performing a curve-fitting method for calculating values of $B_1$, $B_2$ and $\tau_1$, $\tau_1$. Consequently, the relationship model can be depicted as a relation curve for predicting the threshold voltage shift of the PMOS transistor when exceeding the testing time.

Figure 2:
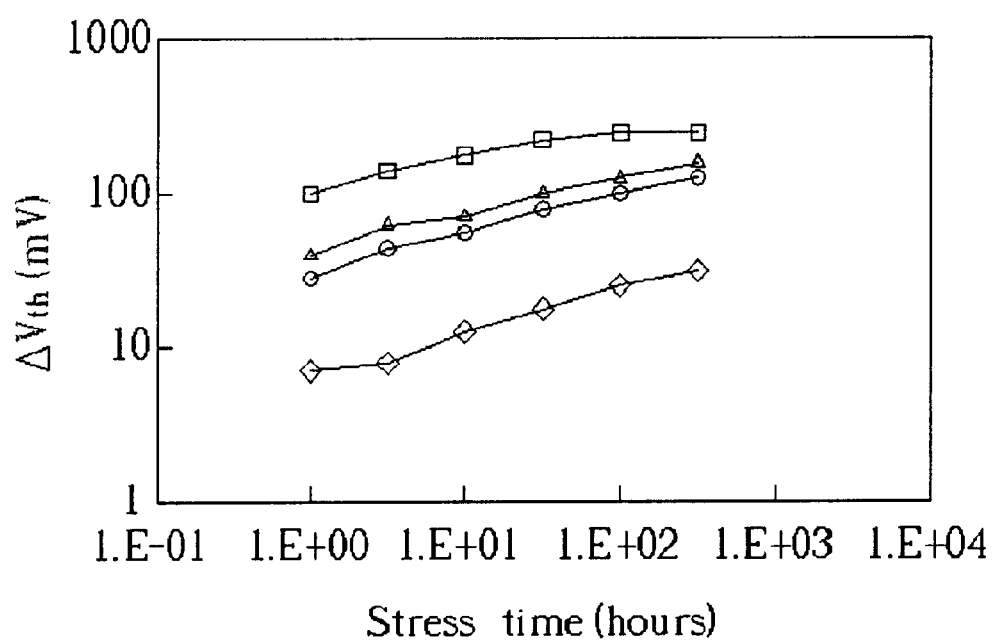
FIG. 2 is a relation graph displaying relationship of threshold voltage shift vs. time of a PMOS transistor stressed with different stress temperatures.

FIG. 2 and FIG. 3 are applications of the method according to the present invention. Please refer to FIG. 2. FIG. 2 is a relation graph of threshold voltage shift vs. time for a PMOS transistor, which is respectively stressed with 180° C., 140° C., 115° C., and 40° C. temperatures, and is simultaneously stressed with a stress voltage of 2.75 volts (V). Different shaped dots of FIG. 2 respectively represent threshold voltage shift of the PMOS transistor measured at six testing points of the above-mentioned four different stress temperatures. Therein, the rectangular dots represent the stress temperature of 180° C., the triangular dots represent the stress temperature of 140° C., the circular dots represent the stress temperature of 115° C., and the diamond dots represent the stress temperature of 40° C. The different groups of experimental data measured in different stress temperatures are respectively used to fit the relationship model by performing a curve-fitting method so as to calculate the values of interface defect constants $B_1, B_2$ and time constants $\tau_1, \tau_1$ of each stress temperature, and the results are shown in FIG. 3. Since the values of each constant in the relationship model are obtained, the relationship model can be depicted as a relation curve of threshold voltage shift vs. time ($\Delta V_{th}$ vs. t). As shown in FIG. 2, the four curves from top to bottom respectively represent a relationship of threshold voltage shift vs. time in a stress temperature of 180° C., 140° C., 115° C., and 40° C. Therefore, threshold voltage shift of the PMOS transistor during any time period can be predicted through the relation curves. The determining method of the present invention uses a group of experimental data measured during a short time period to fit a relationship model so as to depict a relation curve of threshold voltage shift vs. time of a semiconductor device. Therefore, threshold voltage shift of the semiconductor device can be predicted through the relation curve in any time period. In brief, the present invention provides a fast and accurate method of determining negative bias temperature instability (NBTI) of semiconductor products. Comparing to the prior art method, the method according to the present invention only needs to stress and measure a semiconductor device for a short time, and then a relation curve of threshold voltage vs. time is depicted for predicting threshold voltage shift of the device during a longer time period. Therefore, manpower and time costs of the semiconductor products are thereby effectively reduced. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of determining reliability of semiconductor products, the method comprising:

providing a semiconductor wafer, and a plurality of metal-oxide-semiconductor (MOS) transistors being formed on a surface of the semiconductor wafer;

placing the semiconductor wafer in an environment of a stress temperature during a testing time period, and simultaneously stressing the MOS transistor with a stress voltage;

defining a plurality of testing points in the testing time, and measuring a threshold voltage shift of the MOS transistor at each testing point so as to establish a group of experimental data;

providing a relationship model of threshold voltage shift ($\Delta V_{th}$) vs. time (t); and using the group of experimental data and the relationship model to depict a relation curve for predicting the threshold voltage shift of the MOS transistor when exceeding the testing time.

2. The method of claim 1 wherein the model of threshold voltage shift ($\Delta V_{th}$) vs. time (t) is:

$$\Delta V_{th}(t) = B_1[1-\exp(-t/\tau_1)] + B_2[1-\exp(-t/\tau_2)].$$

3. The method of claim 2 wherein $B_1$ and $B_2$ are interface defect constants, and $\tau_1$ and $\tau_1$ are time constants.

4. The method of claim 1 wherein the plurality of MOS transistors comprise N-channel MOS (NMOS), P-channel MOS (PMOS), and C-channel MOS (CMOS) transistors.

5. The method of claim 1 wherein the method is used to experiment negative bias temperature instability (NBTI) of the semiconductor products.

6. The method of claim 1 wherein the testing time is about $10^3$ to $10^4$ seconds.

7. The method of claim 1 wherein the group of experimental data is used to fit the relationship model by performing a curve-fitting method before depicting the relation curve.

8. A method of determining negative bias temperature instability (NBTI) of a P-channel metal-oxide-semiconductor (PMOS) transistor, the PMOS transistor being formed on a semiconductor wafer, the method comprising:

placing the semiconductor wafer in an environment of a stress temperature during a testing time period, and simultaneously stressing the PMOS transistor with a stress voltage;

defining a plurality of testing points in the testing time, and measuring a threshold voltage shift of the PMOS transistor at each testing point so as to establish a group of experimental data;

providing a relationship model of threshold voltage shift ($\Delta V_{th}$) vs. time (t):

$$\Delta V_{th}(t) = B_1[1-\exp(-t/\tau_1)] + B_2[1-\exp(-t/\tau_2)];$$

and using the group of experimental data and the relationship model to depict a relation curve for predicting the threshold voltage shift of the PMOS transistor when exceeding the testing time.

9. The method of claim 8 wherein the testing time is about $10^3$ to $10^4$ seconds.

10. The method of claim 8 wherein $B1$ and $B_2$ are interface defect constants, and $\tau_1$ and $\tau_1$ are time constants.

11. The method of claim 8 wherein the group of experimental data is used to fit the relationship model by performing a curve-fitting method before depicting the relation curve.

* * * * *